(12) United States Patent
Orita et al.

(10) Patent No.: US 6,498,738 B1
(45) Date of Patent: Dec. 24, 2002

(54) REVERSE LEVEL SHIFT CIRCUIT AND POWER SEMICONDUCTOR DEVICE

(75) Inventors: Shoichi Orita, Tokyo (JP); Yoshikazu Tanaka, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,252

(22) Filed: Apr. 9, 2002

(30) Foreign Application Priority Data

Jul. 12, 2001 (JP) ........................................ 2001-212022

(51) Int. Cl.[7] ............................. H02M 3/24; H02M 5/42
(52) U.S. Cl. ........................................... 363/73; 363/74
(58) Field of Search ...................................... 363/73, 74

(56) References Cited

U.S. PATENT DOCUMENTS

| | | | | |
|---|---|---|---|---|
| 4,800,339 A | * | 1/1989 | Tanimoto et al. | 330/253 |
| 5,619,151 A | * | 4/1997 | Akioka et al. | 327/103 |
| 5,680,066 A | * | 10/1997 | Akioka et al. | 327/103 |
| 6,246,351 B1 | * | 6/2001 | Yilmaz | 341/136 |
| 6,259,302 B1 | * | 7/2001 | Phanse et al. | 327/355 |

* cited by examiner

*Primary Examiner*—Bao Q. Vu
(74) *Attorney, Agent, or Firm*—Oblon, Spivak, McClelland, Maier & Neustadt, P.C.

(57) ABSTRACT

A reverse level shift circuit that is low in cost and excellent in reliability is provided by employing no Pch-DMOS transistor and forming it together with a level shift circuit on one semiconductor substrate. An input voltage signal (VIN) on high side is converted to a current signal by a voltage-current conversion circuit (CV1) and a current source (CS1). Using a Nch-DMOS transistor (ND1) of common gate construction as a high breakdown voltage resistance, the current signal is then transferred to low side, on which the current signal is converted to a voltage signal by a current source (CS2) and a current-voltage conversion circuit (CV2). Thereby, the signal change of the signal (VIN) using potential (HGND) as a reference potential can be outputted as a signal change of signal (VOUT) that uses potential (GND) as a reference potential.

12 Claims, 7 Drawing Sheets

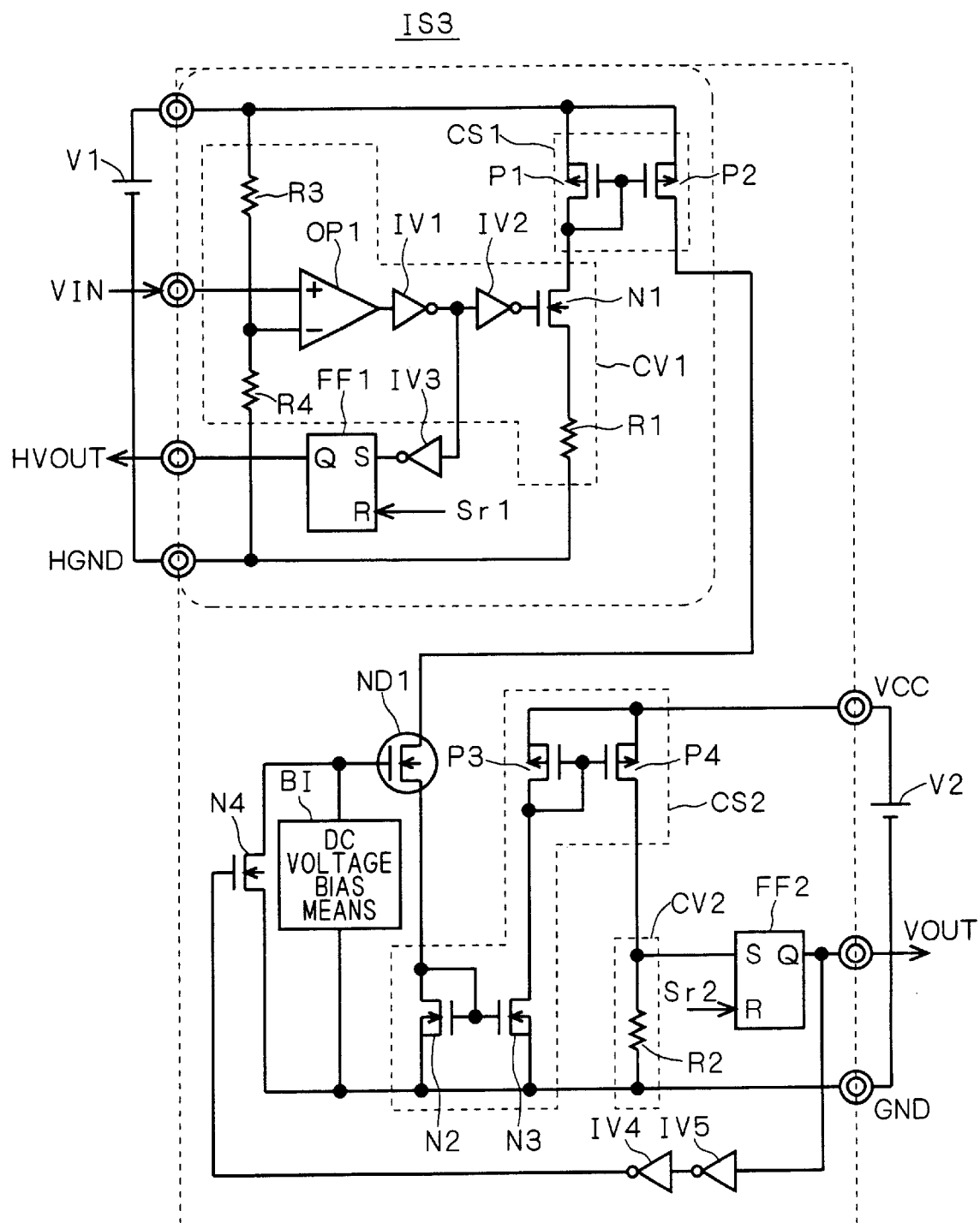
F I G. 5

REVERSE LEVEL SHIFT CIRCUIT AND POWER SEMICONDUCTOR DEVICE

BACKGROUND OF THE INVENTION

1. Field of the Invention

The present invention relates to a reverse level shift circuit for converting a voltage signal on high-voltage side to a voltage signal on low-voltage side, which is used in a power semiconductor device.

2. Description of the Background Art

In a HVIC (high voltage integrated circuit) on which, for example, an inverter, its driving circuit and its protection circuit are contained in a single chip, there is generally a detector for detecting voltage signals. This detector detects whether an abnormal voltage upsurge occurs in the respective switching elements on high-voltage side and low-voltage side of the half bridge of each phase.

FIG. 6 is a diagram illustrating an exemplary configuration of a power semiconductor device containing a circuit to detect whether an abnormal voltage upsurge occurs in a switching element on high-voltage side of a single-phase half bridge. On this circuit, for example, switching elements SW1 and SW2 such as IGBT (insulated gate bipolar transistor) are connected in series, and free wheel diodes D1 and D2 are subjected to inverse-parallel connection with the switching elements SW1 and SW2, respectively. These parts form a half bridge for one phase. The switching element SW1 on high-voltage side serves as a multi-emitter, to one output terminal of which one terminal of a shunt resistance SH is connected. By monitoring the value of voltage drop in the shunt resistance SH, it is detectable whether an abnormal voltage upsurge occurs in the switching element SW1. The other terminal of the shunt resistance SH is connected to a connection point MP of the switching elements SW1 and SW2.

An output signal of voltage drop in the shunt resistance SH is, for example, converted to a digital signal through an AD (from analog to digital) conversion circuit AD, and then inputted to a reverse level shift circuit IS. Hereat, the reverse level shift circuit IS functions to transfer a signal change of voltage drop (i.e., VIN-HGND) in the shunt resistance SH, while lowering its reference potential from potential HGND in the connection point MP to grounded potential GND that is a reference potential of other circuit.

The potential HGND at the connection point MP is high and in a float condition. For detecting output signals, it is therefore desirable that the reference potential is lowered to the grounded potential GND. Especially in the case of polyphase circuits such as three-phase circuit, one microprocessor in a HVIC detects an output signal of each phase and judges whether it is abnormal or not (e.g., it is judged abnormal when voltage upsurges in the shunt resistance exist in two phases). Hence, all the reference potentials of output signals should be lowered to the grounded potential GND, and it is for this reason that the reverse level shift circuit IS is present.

An output signal of the reverse level shift circuit IS (VOUT-GND) is inputted to an abnormality detection/stop signal output circuit DT equivalent to the above-mentioned microprocessor. On this circuit DT, it is detected whether there is an abnormal voltage drop at the shunt resistance SH in each phase, and if an abnormality is detected, a stop signal Sc for stopping the operation of the switching element SW1 is outputted.

The stop signal Sc is applied to a control electrode of the switching element SW1 via a level shift circuit LS and an output circuit OU. The level shift circuit LS functions to transfer the stop signal Sc while increasing its reference potential from the grounded potential GND to the potential HGND of the connection point MP. The output circuit OU functions to amplify the output of the level shift circuit LS.

In the forgoing description, it is not essential that an output signal of voltage drop at the shunt resistance SH be converted to a digital signal by the AD conversion circuit AD. For instance, if the reverse level shift circuit IS or abnormality detection/stop signal output circuit DT can process signals of analog input, the AD conversion circuit AD may be omitted so as to directly input a signal change of voltage drop to the reverse level shift circuit IS.

FIG. 7 is a diagram illustrating a conventional configuration of a reverse level shift circuit IS. On a reverse level shift circuit IS4, a high-side signal detecting circuit HD comprising a comparator etc. receives an input signal VIN and judges whether the value of voltage drop at a shunt resistance SH is greater than a predetermined value. When the former is larger than the latter, the high-side signal detecting circuit HD activates output.

The output of the high-side signal detecting circuit HD is applied via an inverter IV6 to the gate electrode of a Pch-DMOS (P-channel double diffusion metal oxide semiconductor) transistor PD1. When the output of the high-side signal detecting circuit HD is activated, the Pch-DMOS transistor PD1 enters operating state to flow current between its source and drain. Each circuit on the high-side is driven by a higher potential HVCC that a power source V1 generates from the potential HGND.

Since the Pch-DMOS transistor PD1 has high breakdown voltage and breakdown voltage characteristic of several hundreds volt level, it functions as a high-breakdown voltage resistance to perform reverse level shift of signals between the potential HVCC that is high and the grounded potential GND that is low. Current passing through the Pch-DMOS transistor PD1 flows to a resistance R5 on the low side, at which the current is converted to a voltage signal. A voltage drop at the resistance R5 is transferred to an inverter IV7 and an output circuit OT comprising an amplifier etc., and then outputted as an output signal VOUT. Each circuit on the low side is driven by a higher potential VCC that a power source V2 generates from the grounded potential GND.

Thus, the Pch-DMOS transistor PD1 is employed on the reverse level shift circuit IS4. From the viewpoint of voltage control between source and gate, in general, a Pch-transistor is employed on a reverse level shift circuit and a Nch-transistor is employed on a level shift circuit. Accordingly, when a level shift circuit and a reverse level shift circuit are allowed to coexist, it is necessary to form Nch- and Pch-DMOS transistors in a HVIC.

In manufacturing the DMOS transistors, however, it is difficult to form both of the Nch- and Pch-DMOS transistors in the HVIC, while adjusting characteristics, such as the threshold values of both transistors, to their respective desired values. It is especially difficult to form a Pch-DMOS transistor in a substrate at which a Nch-DMOS transistor is present. Hence, it is desired to configure a reverse level shift circuit without employing any Pch-DMOS transistor.

It can also be considered to configure a reverse level shift circuit using photocouplers, without using any DMOS transistor. However, the use of photocouplers increases the number of parts, which tends to raise the cost and results in poor reliability at high temperatures. From the standpoint of the entire arrangement, the configuration preferably contains a transistor that operates electrically.

SUMMARY OF THE INVENTION

According to a first aspect of the invention, a reverse level shift circuit that converts an input voltage signal using a first potential as a reference potential to an output voltage signal using a second potential lower than the first potential, as a reference potential, and then outputs the output voltage signal, comprises: a voltage-current conversion part operating based on the first potential, which converts the input voltage signal to a current signal corresponding to a value of the input voltage signal, then outputs the current signal; a Nch-MOS transistor having a source to which the second potential is applied via a load, a drain responsive to the current signal from the voltage-current conversion part, and a gate to which a fixed potential is applied; and a current-voltage conversion part operating based on the second potential, which converts current from the source of the Nch-MOS transistor to a voltage signal corresponding to a value of the current, and then outputs the voltage signal as the output voltage signal.

According to a second aspect of the invention, the reverse level shift circuit of the first aspect further comprises: a first current source operating based on the first potential, which outputs current corresponding to the current signal from the voltage-current conversion part, to the drain of the Nch-DMOS transistor; and a second current source operating based on the second potential, which contains the load and outputs a current signal corresponding to the current from the source of the Nch-MOS transistor, to the current-voltage conversion part.

According to a third aspect of the invention, the reverse level shift circuit of the second aspect is characterized in that the voltage-current conversion part contains a first resistance to which the input voltage signal is applied to generate the current signal; that the first current source contains a first current mirror circuit that receives the current signal from the voltage-current conversion part and outputs current corresponding to the current signal; that the second current source contains a second current mirror circuit serving as the load, which receives the current from the source of the Nch-MOS transistor and outputs a current signal corresponding to the current; and that the current-voltage conversion part contains a second resistance that receives the current signal from the second current source to cause a voltage drop for generating the output voltage signal.

According to a fourth aspect of the invention, the reverse level shift circuit of the third aspect is characterized in that the voltage-current conversion part further contains an operational amplifier having a negative input terminal and a positive input terminal to which the input voltage signal is applied, and a first transistor having (a) a first current electrode, (b) a second current electrode connected in common to the negative input terminal of the operational amplifier and one terminal of the first resistance, and (c) a control electrode to which output of the operational amplifier is applied, the first potential is applied to the other terminal of the first resistance; that in the current-voltage conversion part, a third potential higher than the second potential by a fixed value is applied to one terminal of the second resistance; that the first current mirror circuit comprises a second transistor having (d) a first current electrode connected to the first current electrode of the first transistor, (e) a second current electrode to which a fourth potential higher than the first potential by a fixed value, and (f) a control electrode connected to the first current electrode, and a third transistor having (g) a first current electrode connected to the drain of the Nch-MOS transistor, (h) a second current electrode to which the fourth potential is applied, and (i) a control electrode connected to the control electrode of the second transistor; and that the second current mirror circuit comprises a fourth transistor having (j) a first current electrode connected to the source of the Nch-MOS transistor, (k) a second current electrode to which the second potential is applied, and (l) a control electrode connected to the first current electrode, and a fifth transistor having (m) a first current electrode connected to the other terminal of the second resistance, (n) a second current electrode to which the second potential is applied, and (o) a control electrode connected to the control electrode of the fourth transistor.

According to a fifth aspect of the invention, the reverse level shift circuit of the third aspect is characterized in: that the second current source further contains a third current mirror circuit operating based on a third potential that is higher than the second potential by a fixed value, which receives a current signal from the second current mirror circuit and then outputs a current signal corresponding to the current signal, to one terminal of the second resistance of the current-voltage conversion part; and that the second potential is applied to the other terminal of the second resistance.

According to a sixth aspect of the invention, the reverse level shift circuit of the fifth aspect is characterized in that the voltage-current conversion part further contains an operational amplifier having a negative input terminal and a positive input terminal to which the input voltage signal is applied, and a first transistor having (a) a first current electrode, (b) a second current electrode connected in common to the negative input terminal of the operational amplifier and one terminal of the first resistance, and (c) a control electrode to which output of the operational amplifier is applied, the first potential is applied to the other terminal of the first resistance; that the first current mirror circuit comprises a second transistor having (d) a first current electrode connected to the first current electrode of the first transistor, (e) a second current electrode to which a fourth potential higher than the first potential by a fixed value, and (f) a control electrode connected to the first current electrode, and a third transistor having (g) a first current electrode connected to the drain of the Nch-MOS transistor, (h) a second current electrode to which the fourth potential is applied, and (i) a control electrode connected to the control electrode of the second transistor; that the second current mirror circuit comprises a fourth transistor having (j) a first current electrode connected to the source of the Nch-MOS transistor, (k) a second current electrode to which the second potential is applied, and (l) a control electrode connected to the first current electrode, and a fifth transistor having (m) a first current electrode, (n) a second current electrode to which the second potential is applied, and (o) a control electrode connected to the control electrode of the fourth transistor; that the third current mirror circuit comprises a sixth transistor having (p) a first current electrode connected to the first current electrode of the fifth transistor, (q) a second current electrode to which the third potential is applied, and (r) a control electrode connected to the first current electrode, and a seventh transistor having (s) a first current electrode, (t) a second current electrode to which the third potential is applied, and (u) a control electrode connected to the control electrode of the sixth transistor; and that in the current-voltage conversion part, the first current electrode of the seventh transistor is connected one terminal of the second resistance, and the second potential is applied to the other terminal of the second resistance.

According to a seventh aspect of the invention, the reverse level shift circuit of the first aspect is characterized in that the input voltage signal is PWM signal, and further comprising an integrating circuit that integrates the voltage signal from the current-voltage conversion part and outputs the result as the output voltage signal.

According to an eighth aspect of the invention, the reverse level shift circuit of the first aspect further comprises a signal output part that based on the input voltage signal, generates and outputs other output voltage signal using the first potential as a reference potential.

According to a ninth aspect of the invention, the reverse level shift circuit of the eighth aspect is characterized in that the signal output part contains an RS flip-flop that receives at its set input terminal the input voltage signal and outputs the mentioned other output voltage signal.

According to a tenth aspect of the invention, the reverse level shift circuit of the first aspect further comprises a control part that stops operation of the Nch-MOS transistor in accordance with a change in the output voltage signal from the current-voltage conversion part.

According to an eleventh aspect of the invention, the reverse level shift circuit of the tenth aspect is characterized in that the control part contains an RS flip-flop that receives at its set input terminal the output voltage signal from the current-voltage conversion part, and a switch that applies the second potential to the gate of the Nch-MOS transistor when output of the RS flip-flop is activated.

According to a twelfth aspect of the invention, a power semiconductor device comprises: a reverse level shift circuit according to the first aspect; switching elements on a high-voltage side and a low-voltage side connected in series; and a stop signal output circuit that receives the output voltage signal of the reverse level shift circuit and outputs a stop signal to stop operation of the switching element on high-voltage side, an output voltage of the switching element on the high-voltage side being used as the input voltage signal applied to the reverse level shift circuit.

In the first aspect of the invention, there is the Nch-MOS transistor having the source to which the second potential is applied via the load, the drain responsive to the current signal from the voltage-current conversion part, and the gate to which the fixed potential is applied. Since the Nch-MOS transistor is used in common gate construction, the value of the current gain between the drain and source is 1, so that the current signal from the voltage-current conversion part on the high side can be directly transferred to the current-voltage conversion part on the low side. This enables to configure a reverse level shift circuit by employing no Pch-DMOS transistor. Therefore, even when a level shift circuit and a reverse level shift circuit are allowed to coexist in a single HVIC, it is unnecessary to form any Pch-DMOS transistor in addition to a Nch-DMOS transistor, thereby making it easy to manufacture the HVIC.

In the second aspect of the invention, by the presence of the first and second power sources, the adverse effect on the output impedance of the voltage-current conversion part and the input impedance of the current-voltage conversion part can be lessened than the case of directly connecting the voltage-current conversion part and current-voltage conversion part to the Nch-MOS transistor. This results in the output voltage signal that faithfully reflects the change of input voltage signal.

In the third or fourth aspect of the invention, the voltage-current conversion part and current-voltage conversion part contain the resistances, and the first and second current sources contain the current mirror circuits. Therefore, a reverse level shift circuit can be configured easily by using these transistors and resistances.

In the fifth or sixth aspect of the invention, the second current source further contains the third current mirror circuit. The output of the third current mirror circuit is applied to one terminal of the second resistance of the current-voltage conversion part, and the second potential is applied to the other terminal of the second resistance. This provides an output voltage signal using the second potential as a reference potential.

In the seventh aspect of the invention, the input voltage signal is PWM signal, and the integrating circuit is added. Since the input voltage signal is a pulse string of which amplitude is constant, it is less susceptible to the influence of the channel length modulation effect of the Nch-MOS transistor. Therefore, it is possible to output an output voltage signal reflecting more faithfully the signal change prior to the PWM signal (the input voltage signal) modulation, by integrating on the integrating circuit a voltage signal from the current-voltage conversion part.

In the eighth or ninth aspect of the invention, the signal output part generates and outputs other output voltage signal using the first potential as a reference potential. Thereby, such other output voltage signal can be applied, as a control signal, to the circuit that operates using the first potential as a reference potential.

In the tenth or eleventh aspect of the invention, the control part stops the operation of the Nch-MOS transistor in accordance with a change of the output voltage signal from the current-voltage conversion part. Therefore, power consumption can be reduced by arranging such that the control part stops the current passing through the Nch-MOS transistor when it receives the change of the output voltage signal.

In the twelfth aspect of the invention, the stop signal output circuit stops the operation of the switching element on high-voltage side when it receives the output voltage signal of the reverse level shift circuit. This permits a power semiconductor device that is low in manufacturing cost and excellent in reliability.

It is an object of the present invention to provide a reverse level shift circuit that is low in cost and excellent in reliability by incorporating it into a driver IC (HVIC containing a level shift circuit), without using any Pch-DMOS transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram illustrating a reverse level shift circuit according to a third preferred embodiment;

DESCRIPTION OF THE PREFERRED EMBODIMENTS

First Preferred Embodiment

A first preferred embodiment of the invention aims at realizing a reverse level shift circuit that converts an input voltage signal on high side to a current signal, and transfers it to low side by using a Nch-DMOS transistor in common gate construction as a high breakdown-voltage resistance, thereby converting the current signal to an output voltage signal. This permits a reverse level shift circuit that is low in cost and excellent in reliability, without employing any Pch-DMOS transistor.

Figure 1:
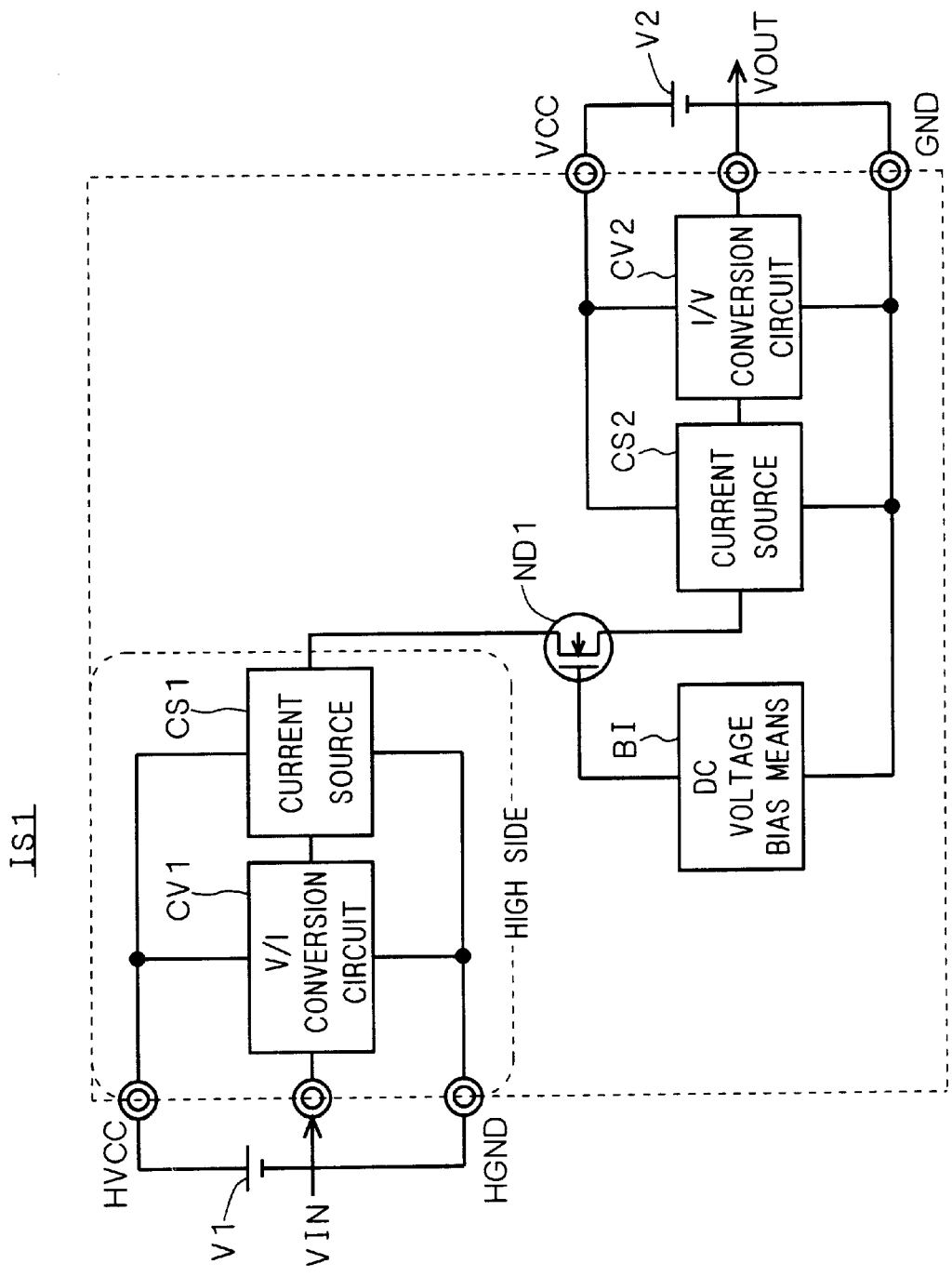
FIG. 1 is a diagram illustrating a reverse level shift circuit according to a first preferred embodiment of the present invention.
Figure 6:
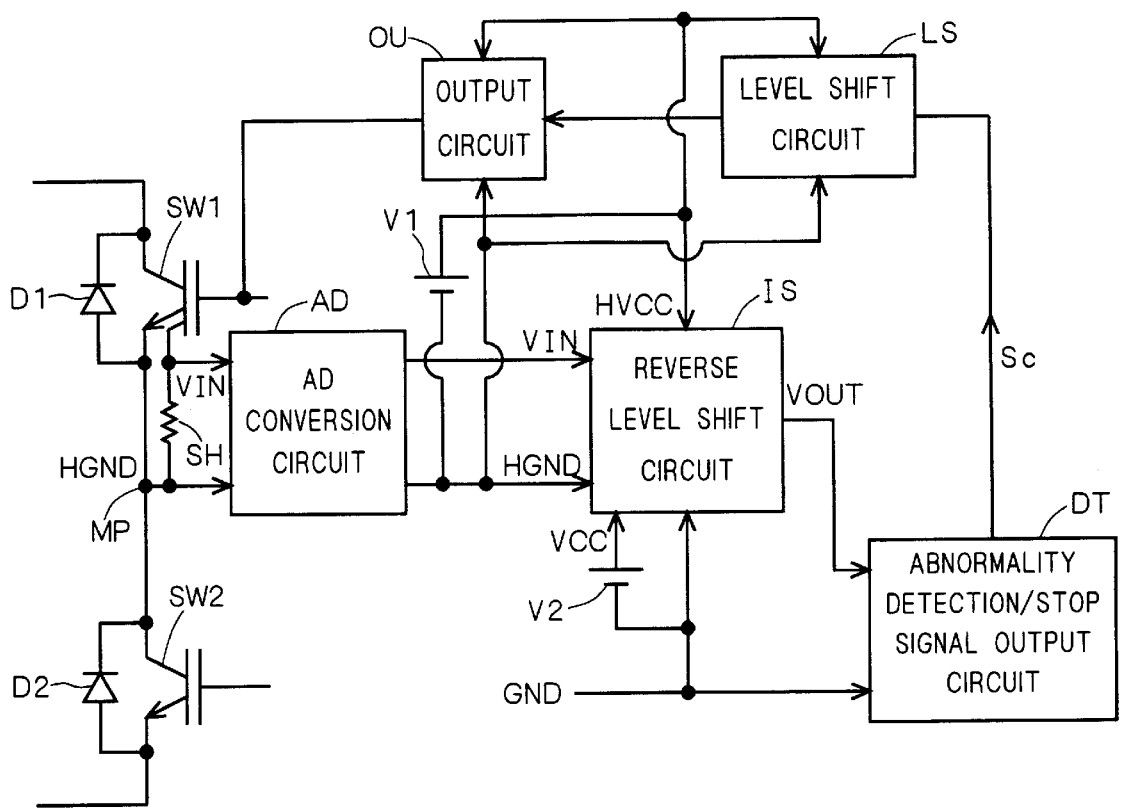
FIG. 6 is a diagram illustrating a power semiconductor device containing a reverse level shift circuit.
Figure 7:
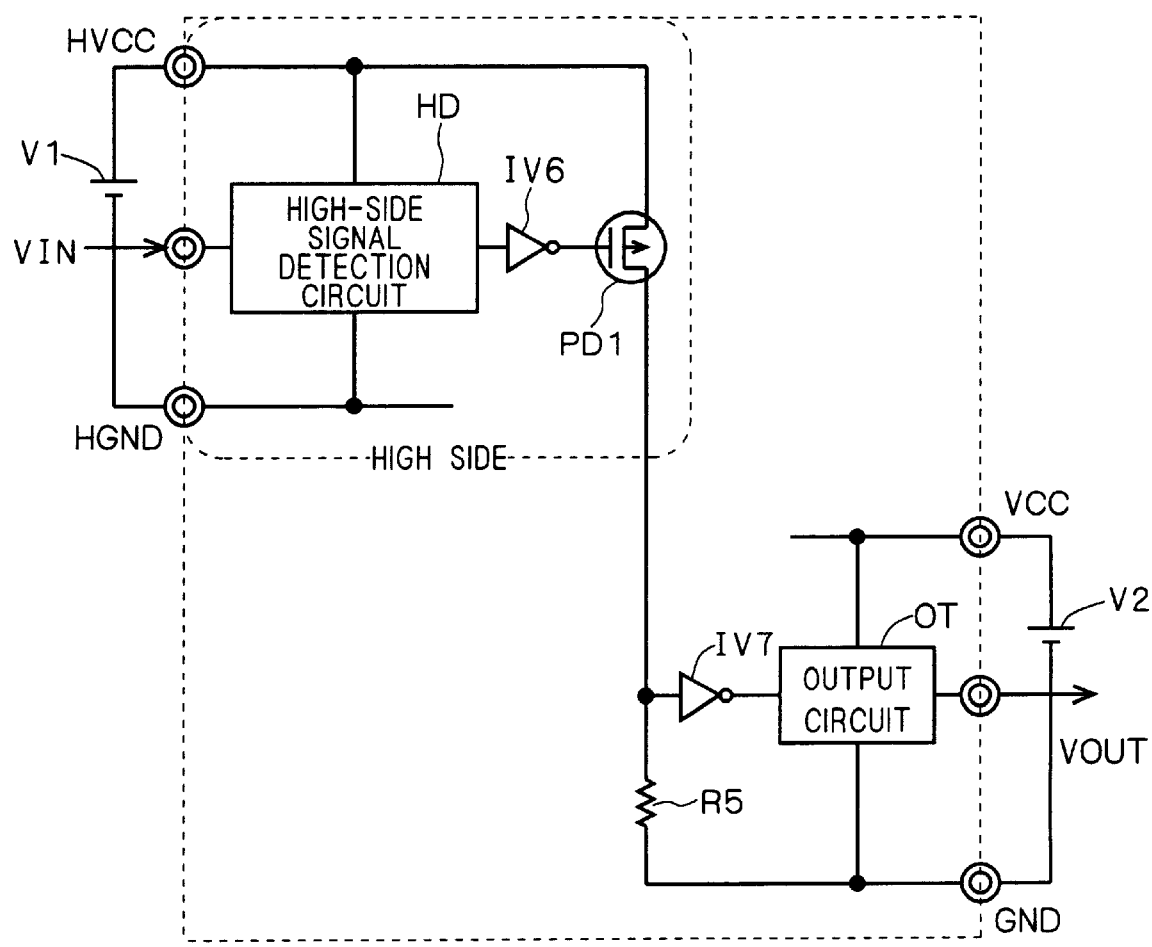
FIG. 7 is a diagram illustrating a conventional reverse level shift circuit.

FIG. 1 is a diagram illustrating the configuration of a reverse level shift circuit IS1 according to a first preferred embodiment. On the circuit IS1, an input voltage signal VIN of which reference potential is high like potential HGND of the connection point MP in FIG. 6, is converted to an output voltage signal VOUT of which reference potential is low like the grounded potential GND in FIG. 6, and the signal VOUT is then outputted.

Referring to FIG. 1, the reverse level shift circuit IS1 comprises, as a high-side circuit, a voltage-current conversion circuit CV1 that converts an input voltage signal VIN to a current signal corresponding to its value and then outputs the current signal, and a current source CS1 that outputs current corresponding to the current signal from the voltage-current conversion circuit CV1.

Both of the voltage-current conversion circuit CV1 and current source CS1 operate based on the potential HGND and a higher potential HVCC that a power source V1 generates from the potential HGND.

Nch-DMOS transistor ND1 is disposed on the reverse level shift circuit IS1. The current outputted from the current source CS1 is applied to the drain of the Nch-DMOS transistor ND1, and a fixed potential that a DC voltage bias means BI generates from the grounded potential GND is applied to the gate of the transistor ND1.

Further, the reverse level shift circuit IS1 comprises, as a low-side circuit, a current source CS2 that outputs current corresponding to a current signal from the source of the Nch-DMOS transistor ND1, and a current-voltage conversion circuit CV2 that converts current outputted from the current source CS2 to a voltage signal corresponding to the value of the current, and then outputs the voltage signal.

Both of the current-voltage conversion circuit CV2 and current source CS2 operate based on the grounded potential GND and a higher potential VCC that a power source V2 generates from the grounded potential GND. tit The current source CS2 also functions as a load connected to the source of the Nch-DMOS transistor ND1.

The operation of the reverse level shift circuit IS1 will next be described. An input voltage signal VIN (a digital signal of binary pulse train, or an analog signal that varies continuously) is converted to a current signal on the voltage-current conversion circuit CV1, and the current signal is then applied to the Nch-DMOS transistor ND1 via the current source CS1.

Since the Nch-DMOS transistor ND1 has high breakdown voltage and breakdown voltage characteristic of several hundreds volt level, it can function as a high breakdown voltage resistance for performing signal reverse level shifts between the potential HVCC that is high and the grounded potential GND that is low.

A fixed potential is applied to the gate of the Nch-DMOS transistor ND1, a current signal that varies is applied from the current source CS1 to its drain, and the current source CS2 as a load is connected to its source. That is, the Nch-DMOS transistor ND1 is of common gate construction. Therefore, the value of the current gain between the drain and source is 1.

A current signal outputted from the source of the Nch-DMOS transistor ND1 is applied via the current source CS1 to the current-voltage conversion circuit CV2. The current signal is converted to a voltage signal corresponding to the value of the current signal, and then outputted as an output voltage signal VOUT.

Thus, since the Nch-DMOS transistor ND1 is used in common gate construction, the value of the current gain between the drain and source can be 1. As a result, the current signal outputted from the voltage-current conversion circuit CV1 on high side can be directly transferred to the current-voltage conversion circuit CV2 on low side. Therefore, the reverse level shift circuit can be configured without using any Pch-DMOS transistor. Even when a level shift circuit and a reverse level shift circuit are allowed to coexist in a single HVIC, it is unnecessary to form any Pch-DMOS transistor in addition to a Nch-MOS transistor, thus making it easy to manufacture the HVIC.

Further, on the reverse level shift circuit IS1, each of the voltage-current conversion circuit CV1 and current-voltage conversion circuit CV2 is not directly connected to the Nch-DMOS transistor ND1, and the current sources CS1 and CS2 are respectively interposed therebetween. Thereby, the adverse effect on the output impedance of the voltage-current conversion circuit CV1 and the input impedance of the current-voltage conversion circuit CV2 can be lessened than the case of directly connecting the circuits CV1 and CV2 to the Nch-DMOS transistor ND1. This permits an output voltage signal VOUT that faithfully reflects a change of the input voltage signal VIN.

Application of the reverse level shift circuit IS1 to the power semiconductor device of FIG. 6 results in such a power semiconductor device that is low in manufacturing cost and excellent in reliability.

Figure 2:
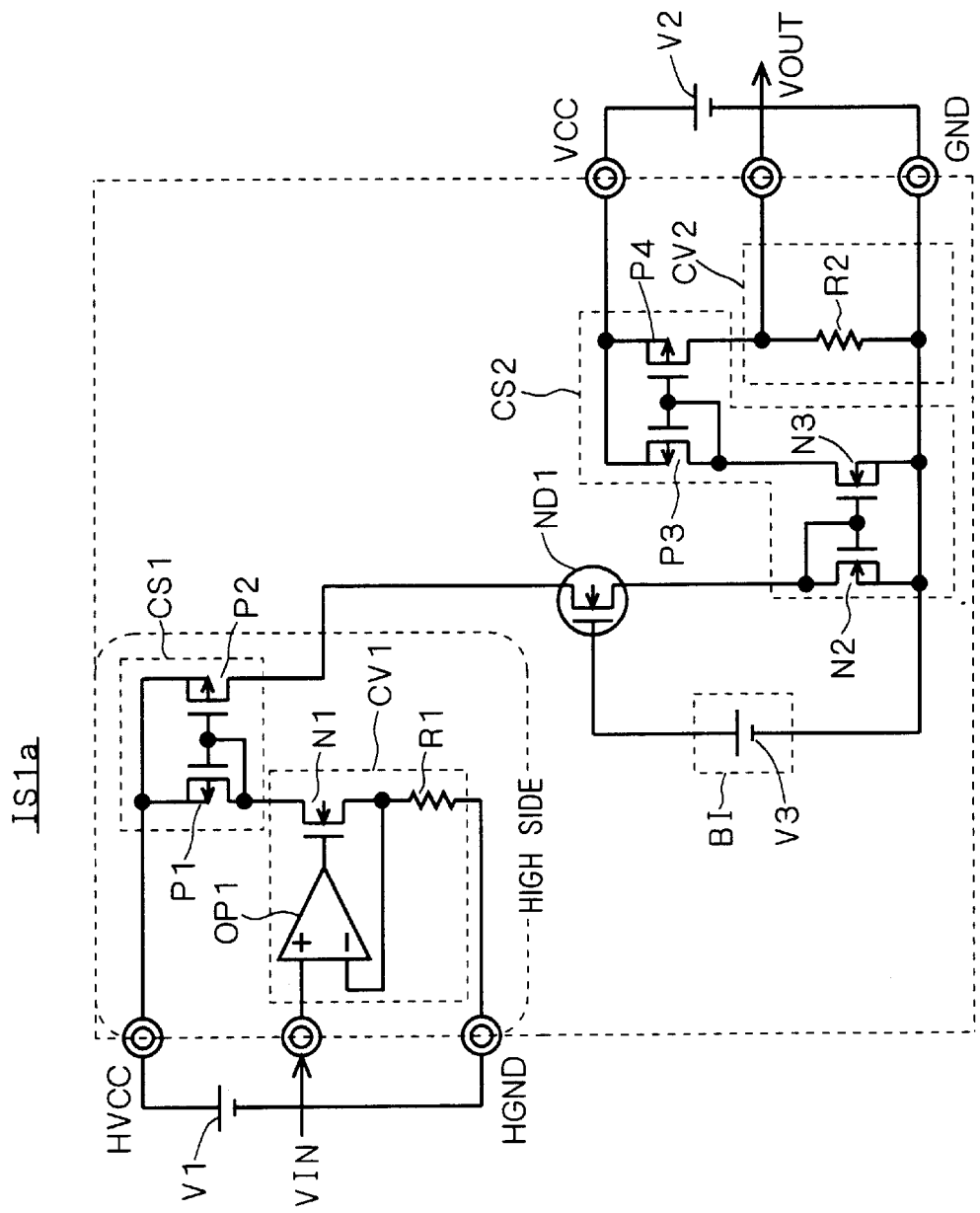
FIGS. 2 and 3 are diagrams illustrating in more detail the configuration of the reverse level shift circuit of the first preferred embodiment.
Figure 3:
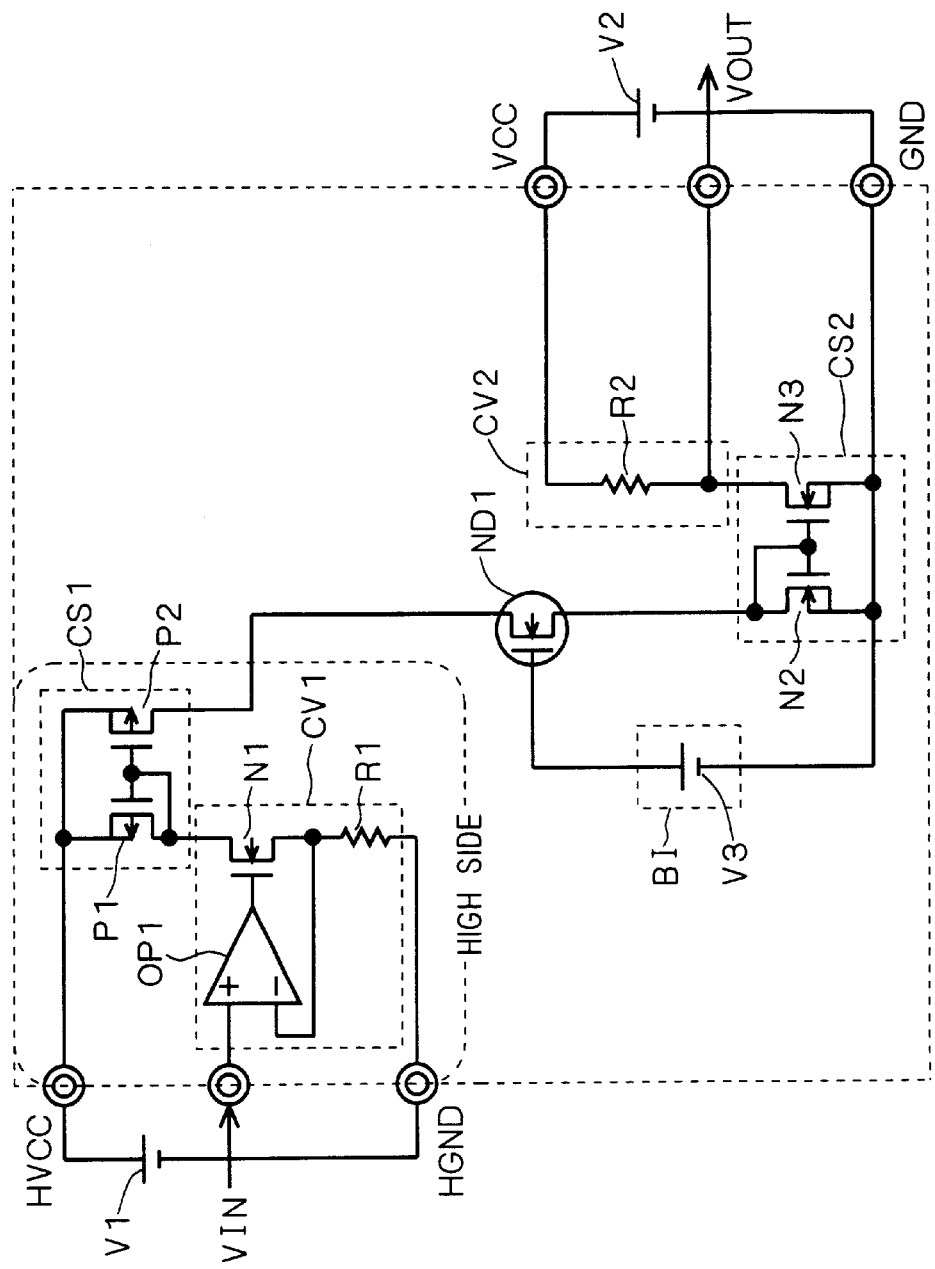

FIGS. 2 and 3 are diagrams illustrating in more detail the configuration of the reverse level shift circuit IS1, assuming the case that an input voltage signal VIN is the value of a voltage drop itself in the shunt resistance SH of FIG. 6, namely an analog signal.

On a reverse level shift circuit IS1a in FIG. 2, a voltage-current conversion circuit CV1 is made up of an operational amplifier OP1, a Nch-MOS transistor N1, and a resistance R1. An input voltage signal VIN is applied to the positive input terminal of an operation amplifier OP1. One terminal of the resistance R1 and the source of the Nch-MOS transistor N1 are connected in common to the negative input terminal of the operational amplifier OP1. Output of the operational amplifier OP1 is applied to the gate of the Nch-MOS transistor N1. Potential HGND is applied to the other terminal of the resistance R1.

The resistance R1, operational amplifier OP1, and Nch-MOS transistor N1 form the so-called attraction type constant current circuit. On the attraction type constant current circuit, an input voltage signal VIN to be inputted to the positive input terminal of the operational amplifier OP1 is applied to the resistance R1 by imaginary short, and a change of the input voltage signal VIN is converted to a current signal passing through the resistance R1. The value of the current signal is proportional to the value of the input voltage signal VIN. Then, current having the same value as this current signal is derived from the drain of the Nch-MOS transistor N1. That is, the attraction type constant current circuit functions as a voltage-current conversion circuit.

The current source CS1 is made up of a current mirror circuit containing Pch-MOS transistors P1 and P2. On receipt of a current signal that the voltage-current conversion circuit CV1 outputs, the current mirror circuit outputs current having a value corresponding to the current signal.

The current mirror circuit is, for example, constructed as follows. Potential HVCC is applied in common to the sources of the Pch-MOS transistors P1 and P2. The gate of the Pch-MOS transistor P1 is connected to its drain. The drain of the Nch-MOS transistor N1 of the voltage-current conversion circuit CV1 is also connected to the drain of the Pch-MOS transistor P1. The gate of the Pch-MOS transistor P2 is connected to the gate of the Pch-MOS transistor P1. The drain of the Pch-MOS transistor P2 is connected to the drain of the Nch-DMOS transistor ND1, thereby transferring current signals.

DC voltage bias means BI applying a fixed potential to the gate of the Nch-DMOS transistor ND1 is, for example, made up of a DC voltage source V3.

A current source CS2 is made up of a current mirror circuit containing Nch-MOS transistors N2 and N3 (which serves as a load of the common gate construction), and a current mirror circuit containing Pch-MOS transistors P3 and P4. The current mirror circuit containing the Nch-MOS transistors N2 and N3 receives a current signal from the Nch-DMOS transistor ND1, and then outputs current having a value corresponding to the current signal. This output is then transferred to the current mirror circuit containing the transistors P3 and P4, from which current having a value corresponding to this output is outputted again.

The current mirror circuit containing the transistors N2 and N3 is, for example, constructed as follows. Potential GND is applied in common to the sources of the Nch-MOS transistors N2 and N3. The gate of the Nch-MOS transistor N2 is connected to its drain. The source of the Nch-DMOS transistor ND1 is also connected to the drain of the Nch-MOS transistor N2. The gate of the Nch-MOS transistor N3 is connected to the gate of the Nch-MOS transistor N2.

The current mirror circuit containing the transistors P3 and P4 is, for example, constructed as follows. Potential VCC is applied in common to the sources of the Pch-MOS transistors P3 and P4. The gate of the Pch-MOS transistor P3 is connected to its drain. The drain of the Nch-MOS transistor N3 is also connected to the drain of the Pch-MOS transistor P3. The gate of the Pch-MOS transistor P4 is connected to the gate of the Pch-MOS transistor P3. A current signal outputted from the drain of the Pch-MOS transistor P2 is applied to a current-voltage conversion circuit CV2.

The current-voltage conversion circuit CV2 is made up of a resistance R2. A current signal from the current source CS2 is applied to the resistance R2, and a voltage drop in the resistance R2 becomes an output voltage signal VOUT.

Thus, with the arrangement such that the voltage-current conversion circuit CV1 and current-voltage conversion circuit CV2 contain the respective resistances, and the current sources CS1 and CS2 contain the respective current mirror circuits, a reverse level shift circuit can be configured easily by using these transistors and resistances.

A circuit IS1b in FIG. 3 is a modification of the circuit of FIG. 2. Specifically, the current mirror circuit containing the transistors P3 and P4 is omitted, and the output of the current mirror circuit containing the transistors N2 and N3 is connected to one terminal of the resistance R2, so as to apply potential VCC to the other terminal of the resistance R2. With this configuration, although an output voltage signal VOUT becomes a signal using the potential VCC as a reference potential, the number of transistors can be reduced.

On the other hand, with the configuration of FIG. 2, although the number of transistors is increased, it can provide the output voltage signal using the grounded potential GND as a reference potential.

The foregoing description has been made taking the Nch-DMOS transistor as example. Alternatively, there may be employed other high breakdown voltage type Nch-MOS transistor, e.g., VMOS transistor of which gate electrode is formed in a V-shape groove.

FIGS. 2 and 3 show the circuit configurations in which the input voltage signal VIN is an analog signal. For instance, when the input voltage signal VIN is a digital signal, the voltage-current conversion circuit CV1 may contain a DA (from digital to analog) conversion circuit for applying an analog voltage signal to the resistance R1.

Second Preferred Embodiment

A second preferred embodiment is a modification of the reverse level shift circuit of the first preferred embodiment. Assuming the case that an input voltage signal VIN is PWM signal, an integrating circuit is added which integrates a voltage signal from the current-voltage conversion circuit CV2 and then outputs it as an output voltage signal VOUT.

The input voltage signal VIN can be various signals, such as the digital signal that the AD conversion circuit AD outputs, as shown in FIG. 6, or the analog signal as described with respect to the circuits of FIGS. 2 and 3 in the first preferred embodiment. The second preferred embodiment will be described with respect to the case that the input voltage signal VIN is PWM (pulse width modulation) pulse signal of which pulse width is modulated.

When an input voltage signal VIN is an analog signal, for example, the circuit of FIG. 2 or FIG. 3 of the first preferred embodiment can provide a signal that faithfully reflects a signal change of the input voltage signal VIN to some extent, as an output voltage signal VOUT.

However, strictly speaking, it can be considered that since the signal change of the input voltage signal VIN is subjected to the influence of the channel length modulation effect of the Nch-DMOS transistor ND1, the signal change may not be transferred exactly to the output voltage signal VOUT.

On the other hand, when the input voltage signal VIN is PWM signal, its voltage amplitude is constant, and its pulse width has different lengths. Thereby, on the circuit of FIG. 2 or FIG. 3, the value of current passing through the resistance R1 is constant, and the length of time the current flows is different for different pulses. In this instance, since the current has a constant value, it is less susceptible to the influence of the channel length modulation effect of the Nch-DMOS transistor ND1.

Also, the value of a voltage drop in the resistance R2 is constant, and there is outputted a PWM voltage signal in which only the length of time the voltage is generated is different for different pulses. Accordingly, by adding an integrating circuit that integrates in time a voltage drop of the resistance R2, a voltage waveform that the integrating circuit outputs is capable of faithfully reflecting the signal change prior to the PWM signal modulation.

In the power semiconductor device in FIG. 6, for example, modulation to PWM signal may be performed easily with a known PWM modulation circuit in place of the AD conversion circuit AD.

Figure 4:
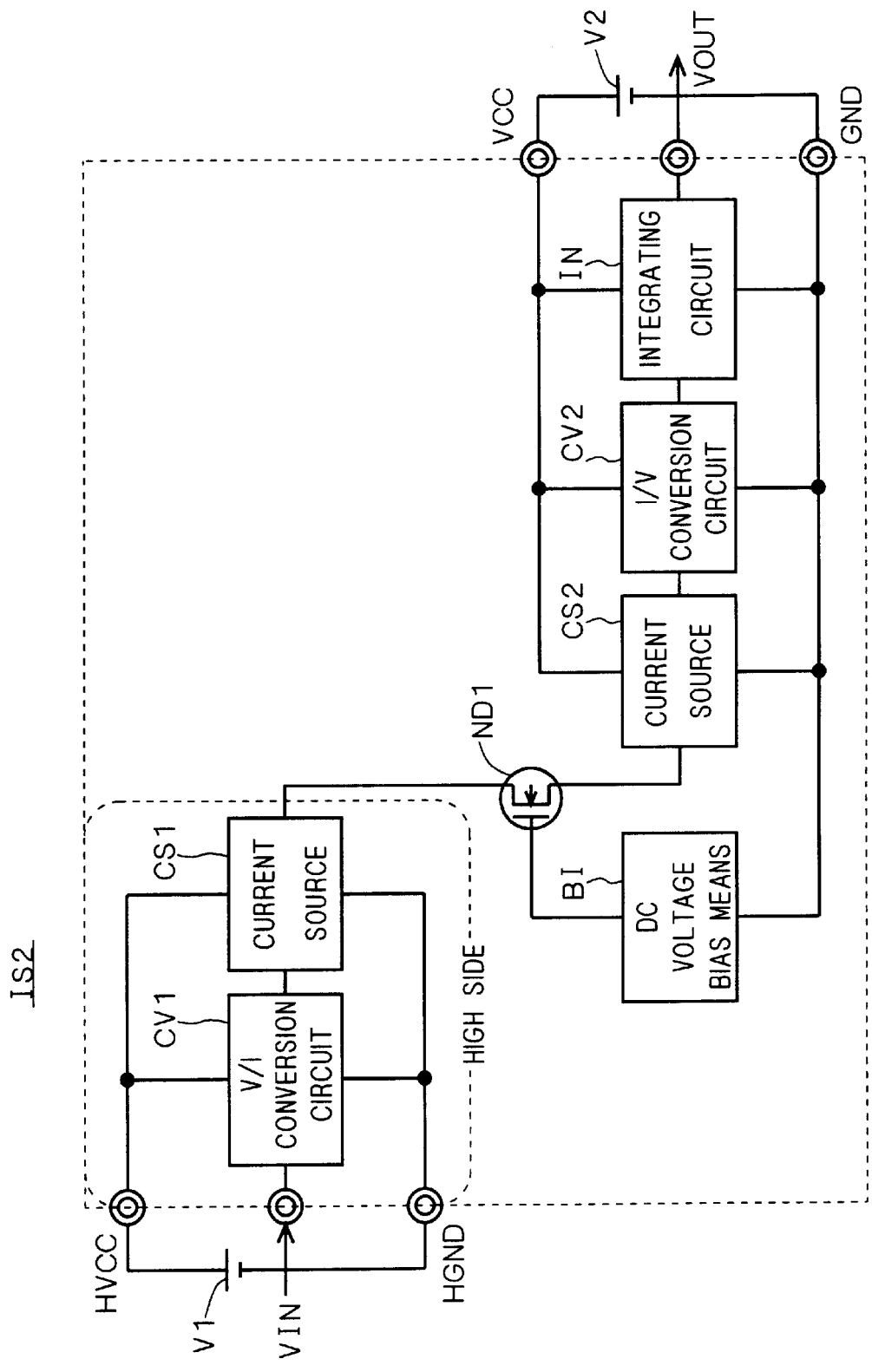
FIG. 4 is a diagram illustrating a reverse level shift circuit according to a second preferred embodiment.

FIG. 4 is a diagram illustrating a reverse level shift circuit IS2 according to the second preferred embodiment. In FIG. 4, like parts as in the reverse level shift circuit IS1 of the first preferred embodiment have similar reference numerals. As shown in FIG. 4, the reverse level shift circuit IS2 is obtained by adding an integrating circuit IN to the reverse level shift circuit IS1. A known CR circuit or a circuit containing an operational amplifier may be used as the integrating circuit IN.

Otherwise, the configuration is the same as the reverse level shift circuit of the first preferred embodiment, and therefore, its description is omitted.

Third Preferred Embodiment

A third preferred embodiment is a modification of the reverse level shift circuit of the first preferred embodiment. Specifically, a signal output part that is capable of outputting other output voltage signal using potential HGND on high side, as a reference potential, is disposed. And the reverse level shift circuit of this embodiment can stop the operation of the Nch-DMOS transistor ND1 in accordance with a change of an output voltage signal from the current-voltage conversion circuit CV2.

Consider now the case that in the power semiconductor device of FIG. 6, there is another circuit similar to the abnormality detection/stop signal output circuit DT, which operates using potential HGND on high side as a reference potential. It may be arranged such that the reverse level shift circuit IS generates a new output signal using potential HGND as a reference potential, and applies it, as a control signal, to the another circuit so as to control the switching element SW1 on high-voltage side. For example, the stop signal Sc of the abnormality detection/stop signal output circuit DT may be arranged to be inputted to the control electrode of the switching element SW2 on low-voltage side, without passing through the level shift circuit LS. To this end, it is necessary that on the reverse level shift circuit IS, a new output voltage signal using potential HGND on high side as a reference potential, is generated as a stop signal on high side.

On the reverse level shift circuit of the first preferred embodiment, the Nch-DMOS transistor ND1 permits current to continue flowing during the time the input voltage signal VIN is inputted. Whereas in the case with the power semiconductor device of FIG. 6, it can be considered that once any abnormality is detected, from then on, no current is needed in the Nch-DMOS transistor ND1. In this instance, power consumption can be reduced by disposing a control part that stops the current passing through the Nch-DMOS transistor ND1 when it receives a change in an output voltage signal VOUT.

The third preferred embodiment aims at realizing a reverse level shift circuit to meet these requirements.

FIG. 5 is a diagram illustrating a reverse level shift circuit IS3 according to the third preferred embodiment. In FIG. 5, like parts as in the reverse level shift circuit IS1 of the first preferred embodiment have similar reference numerals.

Referring to FIG. 5, on the high side of the reverse level shift circuit IS3, there are resistances R3 and R4 connected in series between potential HVCC and potential HGND, and the voltage value divided by both resistances is inputted to the negative input terminal of an operational amplifier OP1. That is, the operational amplifier OP1 is used as a comparator, which compares the voltage value divided by the resistances and an input voltage signal VIN, and then activates an output signal when the input voltage signal VIN is greater.

Output of the operational amplifier OP1 is transferred to a Nch-MOS transistor N1 via inverters IV1 and IV2 connected in series. Hereat, the Nch-MOS transistor N1 functions as a switch.

In the third preferred embodiment, the functions of the operational amplifier OP1 and Nch-MOS transistor N1 are different from that in the first preferred embodiment, whereas the function of a voltage-current conversion circuit CV1 is the same. That is, there is no change in the function of converting an input voltage signal VIN to a current signal in a resistance R1.

Output of the inverter IV1 is inputted via an inverter IV3 to a set input terminal of an RS flip-flop FF1 using potential HGND as a reference potential. The RS flip-flop FF1 corresponds to the signal output part described at the beginning of this embodiment, and its output voltage signal HVOUT corresponds to the mentioned other output voltage signal. The delay time in each of the inverters IV1 to IV3 is designed so as to have a value suited for the desired operation. A reset signal Srl from the exterior is inputted to a reset input terminal of the RS flip-flop FF1.

Thus, by allowing the RS flip-flop FF1, namely a signal output part, to generate and output an output voltage signal HVOUT using potential HGND as a reference potential, it is possible to apply the output voltage signal HVOUT, as a control signal, to the circuit that operates using the potential HGND as a reference potential.

In addition, on the low side of the reverse level shift circuit IS3, a Nch-MOS transistor N4 serving as a switch is disposed between the gate of the Nch-DMOS transistor ND1 and grounded potential GND. By controlling the gate voltage of the transistor N4, the grounded potential GND is applied to the gate of the Nch-DMOS transistor ND1 so as to stop the current passing through the Nch-DMOS transistor ND1.

RS flip-flop FF2 is disposed to control the gate voltage of the Nch-MOS transistor N4 by its output. An output voltage signal from a current-voltage conversion circuit CV2 is inputted to a set input terminal of the RS flip-flop FF2, and a reset signal Sr2 is inputted to its reset input terminal.

Output of the RS flip-flop FF2 becomes an output voltage signal VOUT, which is then applied via inverters IV4 and IV5 to the gate of the Nch-MOS transistor N4. The delay time in each of the inverters IV4 and IV5 is designed so as to be a value suited for the desired operation.

The Nch-MOS transistor N4 and RS flip-flop FF2 correspond to the control part described at the beginning of this embodiment, and function to stop the operation of the Nch-DMOS transistor ND1 in accordance with a change of the output voltage signal from the current-voltage conversion circuit CV2. Therefore, power consumption can be reduced by arranging such that the control part stops the current passing through the Nch-DMOS transistor ND1 when it receives a change in the output voltage signal VOUT.

Otherwise, the configuration is the same as the reverse level shift circuit of the first preferred embodiment, and therefore, its description is omitted.

While the invention has been shown and described in detail, the foregoing description is in all aspects illustrative and not restrictive. It is therefore understood that numerous modifications and variations can be devised without departing from the scope of the invention.

What is claimed is:

1. A reverse level shift circuit that converts an input voltage signal using a first potential as a reference potential to an output voltage signal using a second potential lower than said first potential, as a reference potential, and then outputs said output voltage signal, said reverse level shift circuit comprising:

a voltage-current conversion part operating based on said first potential, which converts said input voltage signal to a current signal corresponding to a value of said input voltage signal, then outputs said current signal;

a Nch-MOS transistor having a source to which said second potential is applied via a load, a drain responsive to the current signal from said voltage-current conversion part, and a gate to which a fixed potential is applied; and a current-voltage conversion part operating based on said second potential, which converts current from said source of said Nch-MOS transistor to a voltage signal corresponding to a value of said current, and then outputs said voltage signal as said output voltage signal.

2. The reverse level shift circuit according to claim 1 further comprising:

a first current source operating based on said first potential, which outputs current corresponding to said current signal from said voltage-current conversion part, to said drain of said Nch-MOS transistor; and a second current source operating based on said second potential, which contains said load and outputs a current signal corresponding to said current from said source of said Nch-MOS transistor, to said current-voltage conversion part.

3. The reverse level shift circuit according to claim 2 wherein said voltage-current conversion part contains a first resistance to which said input voltage signal is applied to generate said current signal;

said first current source contains a first current mirror circuit that receives said current signal from said voltage-current conversion part and outputs current corresponding to said current signal;

said second current source contains a second current mirror circuit serving as said load, which receives said current from said source of said Nch-MOS transistor and outputs a current signal corresponding to said current; and said current-voltage conversion part contains a second resistance that receives said current signal from said second current source to cause a voltage drop for generating said output voltage signal.

4. The reverse level shift circuit according to claim 3 wherein said voltage-current conversion part further contains an operational amplifier having a negative input terminal and a positive input terminal to which said input voltage signal is applied, and a first transistor having (a) a first current electrode, (b) a second current electrode connected in common to said negative input terminal of said operational amplifier and one terminal of said first resistance, and (c) a control electrode to which output of said operational amplifier is applied, said first potential is applied to the other terminal of said first resistance;

in said current-voltage conversion part, a third potential higher than said second potential by a fixed value is applied to one terminal of said second resistance;

said first current mirror circuit comprises a second transistor having (d) a first current electrode connected to said first current electrode of said first transistor, (e) a second current electrode to which a fourth potential higher than said first potential by a fixed value, and (f) a control electrode connected to said first current electrode, and a third transistor having (g) a first current electrode connected to said drain of said Nch-MOS transistor, (h) a second current electrode to which said fourth potential is applied, and (i) a control electrode connected to said control electrode of said second transistor; and said second current mirror circuit comprises a fourth transistor having (j) a first current electrode connected to said source of said Nch-MOS transistor, (k) a second current electrode to which said second potential is applied, and (l) a control electrode connected to said first current electrode, and a fifth transistor having (m) a first current electrode connected to the other terminal of said second resistance, (n) a second current electrode to which said second potential is applied, and (o) a control electrode connected to said control electrode of said fourth transistor.

5. The reverse level shift circuit according to claim 3 wherein said second current source further contains a third current mirror circuit operating based on a third potential that is higher than said second potential by a fixed value, said third current mirror circuit receiving a current signal from said second current mirror circuit and outputting a current signal corresponding to said current signal, to one terminal of said second resistance of said current-voltage conversion part; and said second potential is applied to the other terminal of said second resistance.

6. The reverse level shift circuit according to claim 5 wherein said voltage-current conversion part further contains an operational amplifier having a negative input terminal and a positive input terminal to which said input voltage signal is applied, and a first transistor having (a) a first current electrode, (b) a second current electrode connected in common to said negative input terminal of said operational amplifier and one terminal of said first resistance, and (c) a control electrode to which output of said operational amplifier is applied, said first potential is applied to the other terminal of said first resistance;

said first current mirror circuit comprises a second transistor having (d) a first current electrode connected to said first current electrode of said first transistor, (e) a second current electrode to which a fourth potential higher than said first potential by a fixed value, and (f) a control electrode connected to said first current electrode, and a third transistor having (g) a first current electrode connected to said drain of said Nch-MOS transistor, (h) a second current electrode to which said fourth potential is applied, and (i) a control electrode connected to said control electrode of said second transistor;

said second current mirror circuit comprises a fourth transistor having (j) a first current electrode connected to said source of said Nch-MOS transistor, (k) a second current electrode to which said second potential is applied, and (l) a control electrode connected to said first current electrode, and a fifth transistor having (m) a first current electrode, (n) a second current electrode to which said second potential is applied, and (o) a control electrode connected to said control electrode of said fourth transistor;

said third current mirror circuit comprises a sixth transistor having (p) a first current electrode connected to said first current electrode of said fifth transistor, (q) a second current electrode to which said third potential is applied, and (r) a control electrode connected to said first current electrode, and a seventh transistor having (s) a first current electrode, (t) a second current electrode to which said third potential is applied, and (u) a control electrode connected to said control electrode of said sixth transistor; and in said current-voltage conversion part, said first current electrode of said seventh transistor is connected one terminal of said second resistance, and said second potential is applied to the other terminal of said second resistance.

7. The reverse level shift circuit according to claim 1 wherein said input voltage signal is PWM signal, said reverse level shift circuit further comprising:

an integrating circuit that integrates said voltage signal outputted from said current-voltage conversion part and outputs the result as said output voltage signal.

8. The reverse level shift circuit according to claim 1 further comprising:

a signal output part that based on said input voltage signal, generates and outputs other output voltage signal using said first potential as a reference potential.

9. The reverse level shift circuit according to claim 8 wherein said signal output part contains an RS flip-flop that receives at its set input terminal said input voltage signal and outputs said other output voltage signal.

10. The reverse level shift circuit according to claim 1 further comprising:

a control part that stops operation of said Nch-MOS transistor in accordance with a change in said output voltage signal from said current-voltage conversion part.

11. The reverse level shift circuit according to claim 10 said control part containing:

an RS flip-flop that receives at its set input terminal said output voltage signal from said current-voltage conversion part; and a switch that applies said second potential to said gate of said Nch-MOS transistor when output of said RS flip-flop is activated.

12. A power semiconductor device comprising:

a reverse level shift circuit according to claim 1;

switching elements on a high-voltage side and a low-voltage side connected in series; and a stop signal output circuit that receives said output voltage signal of said reverse level shift circuit and outputs a stop signal to stop operation of said switching element of high-voltage side, an output voltage of said switching element on said high-voltage side being used as said input voltage signal applied to said reverse level shift circuit.

* * * * *